(12) United States Patent
Schaedler et al.

(10) Patent No.: US 11,756,799 B1
(45) Date of Patent: Sep. 12, 2023

(54) 3D PRINTED CERAMIC STRUCTURE WITH METAL TRACES

(71) Applicant: HRL Laboratories, LLC, Malibu, CA (US)

(72) Inventors: Tobias Schaedler, Oak Park, CA (US); Kayleigh Porter, Los Angeles, CA (US); Phuong Bui, Thousand Oaks, CA (US)

(73) Assignee: HRL LABORATORIES, LLC, Malibu, CA (US)

(*) Notice: Subject to any disclaimer, the term of this patent is extended or adjusted under 35 U.S.C. 154(b) by 54 days.

(21) Appl. No.: 17/165,825

(22) Filed: Feb. 2, 2021

Related U.S. Application Data

(60) Provisional application No. 62/970,076, filed on Feb. 4, 2020.

(51) Int. Cl.
*H01L 23/15* (2006.01)
*H01L 23/498* (2006.01)
*H01L 23/13* (2006.01)
*H01L 21/48* (2006.01)

(52) U.S. Cl.
CPC ...... *H01L 21/4807* (2013.01); *H01L 21/4857* (2013.01); *H01L 21/4867* (2013.01); *H01L 23/15* (2013.01); *H01L 23/49822* (2013.01); *H01L 23/49838* (2013.01); *H01L 23/13* (2013.01); *H01L 23/49866* (2013.01); *H01L 23/49883* (2013.01)

(58) Field of Classification Search
CPC ............ H01L 21/4807; H01L 21/4857; H01L 21/4867; H01L 23/15; H01L 23/49822; H01L 23/49838; H01L 23/13; H01L 23/49866; H01L 23/49883
USPC .......................................................... 257/668
See application file for complete search history.

(56) References Cited

U.S. PATENT DOCUMENTS

| | | | | |
|---|---|---|---|---|
| 4,889,760 A | * | 12/1989 | Kippenberg | H01G 4/30 428/209 |
| 5,128,494 A | * | 7/1992 | Blum | C04B 35/185 556/11 |
| 5,597,644 A | * | 1/1997 | Araki | H01F 41/16 428/209 |
| 6,140,749 A | * | 10/2000 | Nakatani | H01L 41/0472 310/366 |
| 10,196,464 B1 | | 2/2019 | Zhou et al. | |
| 10,221,284 B2 | | 3/2019 | Eckel | |
| 10,737,984 B2 | | 8/2020 | Schaedler et al. | |
| 10,745,525 B2 | | 8/2020 | Eckel | |
| 10,851,211 B1 | | 12/2020 | Eckel et al. | |

(Continued)

OTHER PUBLICATIONS

Unpublished U.S. Appl. No. 16/029,526, filed Jul. 6, 2018.

(Continued)

*Primary Examiner* — Duy T Nguyen
(74) *Attorney, Agent, or Firm* — Lewis Roca Rothgerber Christie LLP

(57) ABSTRACT

A ceramic article. In some embodiments, the ceramic article includes a ceramic body composed of a ceramic material; and a first conductive trace, the first conductive trace having a first portion entirely within the ceramic material, the first portion having a length of 0.5 mm and transverse dimensions less than 500 microns, the ceramic material including a plurality of ceramic particles in a ceramic matrix.

22 Claims, 10 Drawing Sheets

(56) References Cited

U.S. PATENT DOCUMENTS

| | | | |
|---|---|---|---|
| 2011/0068438 A1* | 3/2011 | Yamazaki | H01Q 1/2216 |
| | | | 257/E29.022 |
| 2016/0005552 A1* | 1/2016 | Blum | H01G 11/56 |
| | | | 429/7 |
| 2018/0148380 A1 | 5/2018 | Eckel et al. | |

OTHER PUBLICATIONS

Website: "C100 Easy Fab", 3DCERAM, https://3dceram.com/en/imprimante-3d/c100-easy-en/, printed Feb. 2, 2021, 6 pages.
Website: "Products", 3DCERAM, https://3dceram.com/en/#imprimantes, printed Feb. 2, 2021, 12 pages.

\* cited by examiner

EDAX ZAF Quantification (Standardless)
Element Normalized
SEC Table : Default

| Element | Wt %   | At %   | K-Ratio | Z      | A      | F      |
|---------|--------|--------|---------|--------|--------|--------|
| C K     | 8.47   | 41.68  | 0.0705  | 1.3444 | 0.6194 | 1.0000 |
| O K     | 2.20   | 8.14   | 0.0075  | 1.3108 | 0.2607 | 1.0001 |
| MgK     | 0.36   | 0.88   | 0.0031  | 1.2922 | 0.6688 | 1.0017 |
| SiK     | 1.35   | 2.84   | 0.0143  | 1.2516 | 0.8376 | 1.0065 |
| AuM     | 6.36   | 1.91   | 0.0530  | 0.8277 | 1.0067 | 1.0004 |
| AgL     | 81.26  | 44.54  | 0.7638  | 0.9462 | 0.9934 | 1.0000 |
| Total   | 100.00 | 100.00 |         |        |        |        |

*FIG. 4B*

EDAX ZAF Quantification (standardless)
Element Normalized
SEC Table : Default

| Element | Wt %   | At %   | K-Ratio | Z      | A      | F      |
|---------|--------|--------|---------|--------|--------|--------|
| O K     | 36.43  | 51.52  | 0.2267  | 1.0590 | 0.5873 | 1.0004 |
| Al K    | 35.13  | 29.46  | 0.3178  | 0.9732 | 0.9246 | 1.0054 |
| Si K    | 21.87  | 17.62  | 0.1837  | 0.9984 | 0.8409 | 1.0006 |
| Pd L    | 6.58   | 1.40   | 0.0482  | 0.7463 | 0.9814 | 1.0000 |
| Total   | 100.00 | 100.00 |         |        |        |        |

| Element | Net Inte. | Bkgd Inte. | Inte. Error | P/B   |
|---------|-----------|------------|-------------|-------|
| O K     | 216.14    | 5.05       | 1.27        | 42.76 |
| Al K    | 269.05    | 11.44      | 1.16        | 23.52 |
| Si K    | 134.97    | 9.34       | 1.67        | 14.44 |
| Pd L    | 10.01     | 4.72       | 8.04        | 2.12  |

*FIG. 5B*

3D PRINTED CERAMIC STRUCTURE WITH METAL TRACES

CROSS-REFERENCE TO RELATED APPLICATION(S)

The present application claims priority to and the benefit of U.S. Provisional Application No. 62/970,076, filed Feb. 4, 2020, entitled "3D PRINTED CERAMIC CHIP CARRIER PACKAGE WITH CO-PRINTED METAL FEATURES AND FABRICATION METHOD", the entire content of which is incorporated herein by reference.

The present application is related to the following U.S. patent documents, each of which is incorporated herein by reference: U.S. Pat. Nos. 10,196,464, 10,221,284, 10,745, 525, 10,737,984, U.S. patent application Ser. No. 15/822, 199, U.S. patent application Ser. No. 16/029,525, and U.S. patent application Ser. No. 16/029,526.

FIELD

One or more aspects of embodiments according to the present disclosure relate to ceramic articles, and more particularly to a ceramic article with metallic elements, and a system and method for fabricating such an article.

BACKGROUND

In ceramic elements such as ceramic chip carriers or packages, it may be advantageous to incorporate metallic elements, to route signals and power to or from a semiconductor die in the chip carrier, or for other purposes, such as heat shielding, temperature sensing (via thermocouples), or sealing a lid on the chip carrier. Related art methods for fabricating such ceramic parts with metallic elements may be constrained with respect to the shapes and dimensions of metallic elements that may be accommodated. For example, high-temperature firing of such a ceramic article may result in interdiffusion between the ceramic and metallic elements of the article, which may degrade the properties of any metallic element with sufficiently small dimensions.

Thus, there is a need for an improved system and method for fabricating a ceramic article.

SUMMARY

According to an embodiment of the present disclosure, there is provided an article, including a ceramic body composed of a ceramic material; and a first conductive trace, the first conductive trace having a first portion entirely within the ceramic material, the first portion having a length of 0.5 mm and transverse dimensions less than 500 microns, the ceramic material including a plurality of ceramic particles in a ceramic matrix.

In some embodiments, the first conductive trace further has a second portion, contiguous with the first portion, the first portion extending substantially in a first direction, and the second portion extending substantially in a second direction, differing from the first direction by at least 5 degrees.

In some embodiments, the ceramic matrix includes between 10 at % and 60 at % Si, between 10 at % and 60 at % C, between 0 at %-40 at % O, and between 0 at % and 50 at % N.

In some embodiments, a particle of the plurality of ceramic particles includes, as a major component, a material selected from the group consisting of alumina, mullite, silica, aluminosilicates, silica based glasses, silicon nitride, silicon carbide, zirconia, boron nitride, magnesium aluminate spinel, yttrium aluminate garnet, rare earth silicates, aluminum phosphate, and combinations thereof.

In some embodiments, the article further includes a second conductive trace, the second conductive trace having a first portion entirely within the ceramic material, the first portion of the second conductive trace having a length of 0.5 mm and transverse dimensions greater than 100 microns and less than 5000 microns.

In some embodiments, the first conductive trace includes at least 50% metal by weight, the metal being selected from the group consisting of gold, silver, copper, nickel, cobalt, iron, Al, Zr, Nb, Mo, Ru, Rh, Pd, Ta, W, Re, Os, Ir, Pd, alloys thereof, and combinations thereof.

In some embodiments, the article further includes: a second conductive trace; and a third conductive trace composed of a different material than the second conductive trace, a portion of the second conductive trace being in contact with a portion of the third conductive trace to form a thermocouple.

In some embodiments, the portion of the second conductive trace and the portion of the third conductive trace are composed of respective different materials of a pair of materials selected from the group of pairs of materials consisting of Ni—Cr and Ni—Al, Fe and Cu—Ni, Ni—Cr and Cu—Ni, Ni—Cr—Si and Ni—Si—Mg, and Pt—Rh and Pt.

In some embodiments, the article is a chip carrier including an integrated circuit die, the first conductive trace being a portion of a conductive path from the integrated circuit die to a conductor on an external surface of the chip carrier.

In some embodiments, the article includes a sheet of metal configured to reflect electromagnetic radiation or to operate as a wire bond pad, the sheet of metal being composed of a material selected from the group consisting of gold, silver, copper, aluminum, and alloys and combinations thereof.

According to an embodiment of the present invention, there is provided a method for manufacturing an article, the method including: forming a layer of a preceramic polymer resin on a surface of a partially-fabricated article; selectively curing the layer in a first region of the surface; and forming one or more patches of a slurry of metallic particles, in a second region of the surface, the second region being different from the first region.

In some embodiments, the curing includes exposing the first region to ultraviolet light.

In some embodiments, the exposing of the first region to ultraviolet light includes exposing the first region to ultraviolet light utilizing stereolithography or digital light projection.

In some embodiments, the forming of the one or more patches of the slurry of metallic particles includes depositing the slurry utilizing a method selected from the group consisting of micro-extrusion, inkjet printing, aerosol jet printing, and combinations thereof.

In some embodiments, the method further includes curing the slurry of metallic particles by temperature or light.

In some embodiments, the method further includes, after the selective curing of the layer in a first region of the surface, and before the forming of the one or more patches of the slurry of metallic particles: removing uncured preceramic polymer resin from the second region of the surface.

In some embodiments, the method further includes performing pyrolysis in an inert atmosphere at one or more temperatures between 600° C. and 1000° C. for 10 minutes to 100 minutes after heating at a heating rate of between 0.5° C./min and 5° C./min.

In some embodiments, the method further includes performing a heat treatment in an oxidizing atmosphere at one or more temperatures between 400° C. and 800° C. for 10 minutes to 100 minutes after heating at a heating rate of between 1° C./min to 10° C./min.

In some embodiments, the method further includes performing a heat treatment in a reducing atmosphere at one or more temperatures between 400° C. and 800° C. for 10 minutes to 100 minutes after heating at a heating rate of between 1° C./min to 10° C./min.

According to an embodiment of the present invention, there is provided a method of manufacture for manufacturing an article, the article including: a ceramic body composed of a ceramic material; and a first conductive trace, the first conductive trace having a first portion entirely within the ceramic material, the first conductive trace including, as a major component, a material selected from the group consisting of copper, silver, gold, and alloys and combinations thereof, the method of manufacture including: forming a layer of a preceramic polymer resin on a surface of a partially-fabricated article; selectively curing the layer in a first region of the surface; forming one or more patches of a slurry of metallic particles, in a second region of the surface, the second region being different from the first region; and performing pyrolysis in an inert atmosphere at one or more temperatures between 600° C. and 800° C.

According to an embodiment of the present invention, there is provided an article, including: a ceramic body composed of a ceramic material; and a first conductive trace, the first conductive trace having a first portion entirely within the ceramic material, the first conductive trace including, as a major component, a material selected from the group consisting of copper, silver, gold, and alloys and combinations thereof, the ceramic material including a ceramic matrix with composition 10-60 at % Si, 10-60 at % C, 0-40 at % 0 and 0-50 at % N the article being manufactured by a method of manufacture including: forming a layer of a preceramic polymer resin on a surface of a partially-fabricated article; selectively curing the layer in a first region of the surface; forming one or more patches of a slurry of metallic particles, in a second region of the surface, the second region being different from the first region; and performing pyrolysis in an inert atmosphere at one or more temperatures between 600° C. and 800° C.

According to an embodiment of the present invention, there is provided a 3D printed article including: a body composed of: a pre-ceramic material, and a first metal-containing trace, the first metal-containing trace being composed of at least 30 vol % metal and having a first portion entirely within the ceramic material, the first portion having a length of 0.5 mm and transverse dimensions less than 500 microns, the pre-ceramic material including a pre-ceramic polymer matrix.

In some embodiments, the pre-ceramic polymer matrix contains one or more of the following: poly-siloxane, poly-carbo-siloxane, poly-carbo-silane, poly-silazane, and poly-silsesquioxane.

In some embodiments, the metal-containing trace contains at least 30 vol % metal particles in an organic matrix.

BRIEF DESCRIPTION OF THE DRAWINGS

These and other features and advantages of the present disclosure will be appreciated and understood with reference to the specification, claims, and appended drawings wherein:

FIG. 4B shows results of an electron dispersive x-ray analysis, according to an embodiment of the present disclosure;

FIG. 5B shows results of an electron dispersive x-ray analysis, according to an embodiment of the present disclosure.

DETAILED DESCRIPTION

Figure 1A:
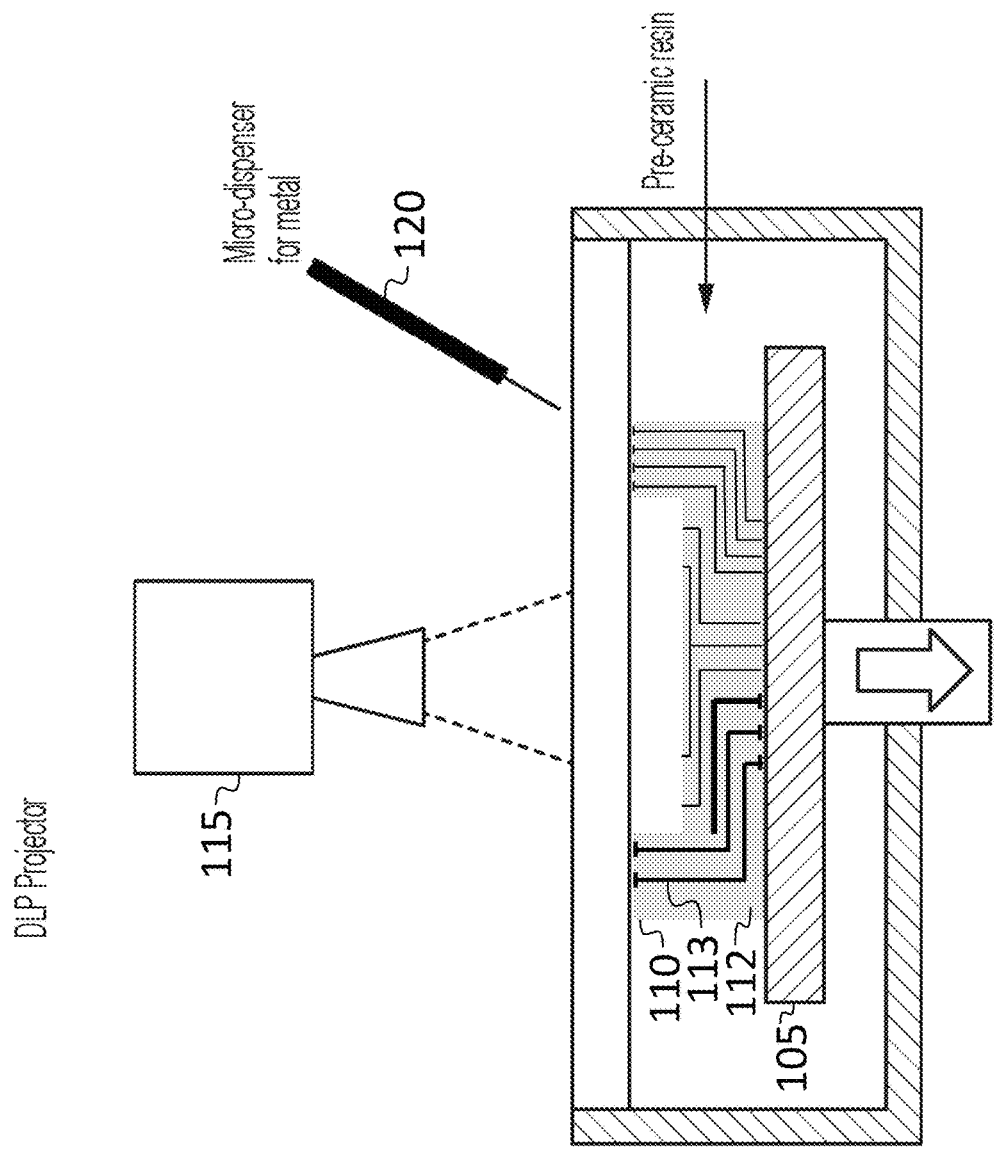
FIG. 1A is a schematic drawing of an apparatus, according to an embodiment of the present disclosure.

The detailed description set forth below in connection with the appended drawings is intended as a description of exemplary embodiments of a three-dimensional (3D) printed ceramic structure with metal traces provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

In some embodiments, a three dimensional (3D) printed article includes (e.g., comprises) a ceramic body and contains metallic features such as fine metallic wires, leads or interconnects with a diameter between 1 and 1000 micrometers (or "microns") that are embedded in the ceramic. The 3D printed article may further include metal pads (e.g., two-dimensional areas, such as a 500×500 micron metal pad with a thickness of 50 microns) for forming connections (e.g., wire bonds) to semiconductor dies, metal pads for electromagnetic shielding, and metal seals which may be employed to hermetically seal the package with a lid. The 3D printed article may be (or include) a package for a microelectronic device or for a micro-electro-mechanical system (MEMS), or it may be (or include) a circuit board connecting different devices. The 3D printed article can be (or include) an interposer, e.g., for connecting an antenna or sensing array to a read out integrated circuit, such as may be used with a millimeter wave phase array or with an infrared focal plane array. The 3D printed article can be (or include) a housing that contains metal wires for heating, cooling, or temperature sensing. In most embodiments, the 3D printed article is smaller than 10×10×10 cm. The 3D printed articles described herein may be referred to for convenience as a "ceramic" article even if the article includes both a ceramic portion (e.g., a ceramic body) and one or more metal elements.

The ceramic material of the article may be a ceramic composite material including ceramic particles with an average size of 0.1 micrometers-5 micrometers embedded in a ceramic matrix. The volume fraction of the ceramic particles may be between 0% and 80%, with the balance being matrix. Suitable ceramic particles may be relatively transparent to UV light and have an index of refraction between about 1 and 2. They include alumina, mullite, silica, aluminosilicates, silica based glasses, silicon nitride, silicon carbide, zirconia, boron nitride, magnesium aluminate spinel, yttrium aluminate garnet, rare earth silicates such as YSiO5 and Y2Si2O7, aluminum phosphate AlPO4, and mixtures thereof. The ceramic matrix may be derived from a pre-ceramic (or "preceramic") polymer, which in turn may be formed, by curing, from a preceramic UV curable resin. The ceramic particles are dispersed in the preceramic resin. The ceramic matrix may include silicon oxycarbide, silicon oxycarb-nitride, silicon carbo-nitride, silicon carbide, silicon nitride or mixtures thereof. The ceramic matrix may be amorphous.

The metallic features may be composed of a metal or alloy including highly conductive metals and alloys comprising a majority of gold, silver, or copper; or high temperature capable refractory alloys comprising tungsten, molybdenum, nickel, cobalt, iron or mixtures thereof. The metallic features, including wires, leads, paths, interconnects, pads, layers, seals, or coatings may be used to make electrical contact, to route signals or power, to shield from electromagnetic radiation such as radiant heat or electromagnetic interference, to generate heat by resistive heating, to sense temperature by means of a thermocouple, to reflect radiative heat inside the package chamber, to bond a device to the package, or to hermetically seal the package.

In some embodiments, the 3D printed article is fabricated by 3D printing or additive manufacturing, using a process in which ceramic and metal are printed layer-by-layer. Typically, the ceramic part of each layer is printed first and then the metal, or vice versa. Such a process may also be referred to as hybrid printing. The preceramic polymer is 3D printed by UV curing of a preceramic resin that contains between 0% and 60 vol % ceramic particles using stereolithography (SLA), digital light processing or another method. A schematic drawing of a fabrication apparatus using a digital light projector (DLP) is shown in FIG. 1A. In the apparatus illustrated in FIG. 1A, a movable platform 105 in a bath of pre-ceramic resin may support a partially completed article 110. At each step of fabrication, the movable platform 105 may be moved downward by the thickness of a layer, typically 10 µm-100 µm, to be formed on the partially completed article 110. The preceramic resin may flow over the top surface of the partially completed article 110 and be selectively cured (e.g., using light from the DLP 115) to form preceramic polymer 112 (illustrated as a gray area within the partially completed article 110 in FIG. 1A) in a first region of the top surface of the partially completed article 110. The first region need not be contiguous and may consist, for example, of disconnected patches, or "islands". The uncured preceramic resin may be removed from the top surface of the partially completed article 110 (e.g., by raising the platform and blowing off the uncured preceramic resin with compressed gas, or, if the preceramic resin is a paste that is applied with a blade or roller, by dissolving away the uncured preceramic resin with a suitable solvent, that only dissolves uncured resin and does not dissolve cured resin).

At each step of fabrication, zero or more patches of a slurry of metallic particles may also be deposited on the top surface of the partially completed article 110, by depositing, using a suitable micro-dispenser 120, a slurry or paste of metallic particles using micro-extrusion, inkjet printing, aerosol jet printing, micro-dispensing, or another method. The patches of the slurry of metallic particles may be in a second region different from (e.g., not overlapping with) the first region. The slurry of metallic particles may include a suitable curable resin and may be cured, e.g., using light or elevated temperature (produced, e.g., by radiant heating), after each step of depositing the patches of the slurry of metallic particles. In some embodiments the slurry of metallic particles does not include a curable resin or is left uncured and the next process affecting this slurry is the sintering process discussed below. More than one different kind of slurry of metallic particles may be deposited (e.g., by respective different dispensers, e.g., nozzles or extruders). In some embodiments, the ceramic features in the layer are printed first and then material is removed to make room for subsequent deposition of the metal features in that layer. Alternatively, the metal features in the layer are printed first and then the layer is immersed in preceramic resin to print the ceramic features. In some embodiments the metal patches are printed by applying a coating of a metal slurry containing a UV curable resin to the top surface of the partially completed article 110 and selectively curing the metal slurry using SLA or a DLP 115. The uncured metal slurry may then be removed, e.g., using compressed gas or a solvent spray. The incrementally formed metal features 113 are illustrated as black lines within the partially completed article 110 in FIG. 1A.

The preceramic resin may be a liquid or a paste depending, for example, on the volume fraction loading of particles. The particles may be sufficiently small to avoid settling to an unacceptable extent during the fabrication process, e.g., the particles may have a size of 0.5 to 2.0 microns. The particles may have an index of refraction that is sufficiently close to that of the preceramic resin to avoid unacceptable scattering of the curing light used in an SLA or DLP apparatus; in some embodiments the preceramic resin has an index of refraction of 1.5 and the particles have an index of refraction of less than 2.0. The metallic slurry may include (e.g., comprise) a slurry of metallic particles in a thermoset resin or in a UV curable resin, or a combination thereof (e.g., with the slurry containing 5 wt % or more of metal). In some embodiments, the preceramic polymer features in the layer are printed first (e.g., by applying a layer of preceramic resin and selectively hardening portions of the layer, using, e.g., SLA or DLP), and then material is removed to make room for subsequent deposition of the metal features in that layer. Alternatively, the metal features in the layer are printed first and then the gaps between, and regions around, the metal features are filled with preceramic resin (e.g., the layer is immersed in liquid preceramic resin, which flows into the regions not containing metal features, or, if the preceramic resin is a paste, a layer of paste may be applied to the top surface of the partially fabricated part, e.g., using a suitable movable doctor blade) to print the preceramic polymer features.

The printed composite part may then (when all preceramic and metal components have been formed) be pyrolyzed in an inert atmosphere at temperatures between 600° C. and 1000° C. for 10 minutes to 100 minutes and a heating rate of 0.5° C./min (degrees Celsius per minute) to 5° C./min (in some embodiments, the part is heated from room temperature at a rate of 0.5° C./min-5° C./min to a target temperature in the range of 600° C.-1000° C. The part remains at the target temperature for 10 min-100 min, and is then cooled to room temperature at a rate of 0.5° C./min-5° C./min). Subsequently, an optional heat treatment in an oxidizing atmosphere such as air may be carried out at temperatures between 50° C. and 700° C. for 10 minutes to 100 minutes and a heating rate of approximately 5° C./min to 10° C./min to burn out residual carbon in the metal. Subsequently an optional heat treatment in a reducing atmosphere such as argon with 4% hydrogen may be carried out at temperatures between 500° C. and 1000° C. for 10 minutes to 100 minutes and a heating rate of approximately 5° C./min to 10° C./min to reduce any metal oxide that may have formed previously. After pyrolysis, the composition of the ceramic matrix that is formed from the pre-ceramic polymer may be between 10 at % and 60 at % Si, between 10 at % and 60 at % C, between 0 at %-40 at % O, and between 0 at % and 50 at % N.

Figure 1B:
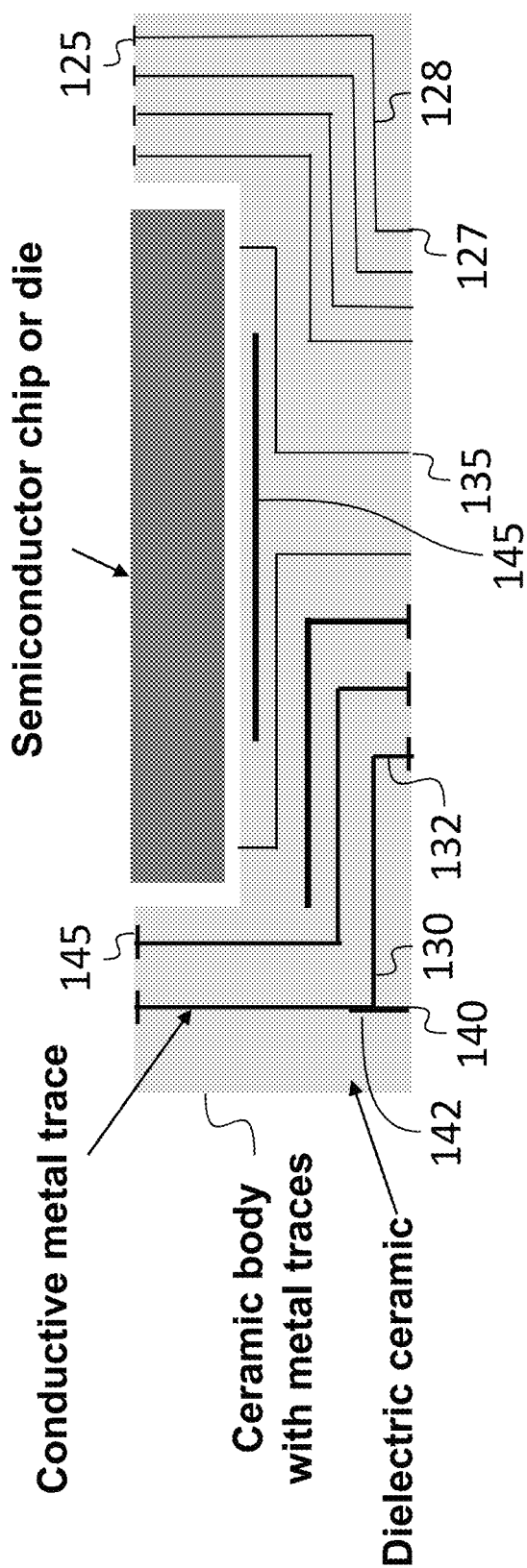
FIG. 1B is a schematic cross-sectional view of a ceramic structure with metal traces, according to an embodiment of the present disclosure.

In some embodiments, the ceramic article is a chip carrier, as illustrated, for example, in FIG. 1B. One or more semiconductor dies, e.g., integrated circuits or MEMS devices, may be contained in the chip carrier, and one or more conductive traces may form conductive paths from an integrated circuit die in the chip carrier to a conductor on an external surface of the chip carrier. A ceramic lid may seal the chip carrier; the lid may be joined (and hermetically sealed) to the body of the chip carrier using metal deposited using the metal deposition methods described herein. Similarly, metal deposited using the metal deposition methods described herein may be used to bond the die or dies to the chip carrier. The bonding materials used may include tin/gold alloys, copper, tungsten, tungsten/molybdenum alloys, and combinations thereof.

In some embodiments, the completed article has a siloxane or carbosilane derived ceramic matrix including (e.g., comprising) silicon oxycarbide and reinforced with ceramic alumina, silica, aluminosilicate or mullite particles and embedded silver wires, leads or interconnects. The ceramic part may have an essentially arbitrary shape, e.g., it may be circular, square, or in the shape of a rectangle, pentagon, or heptagon. In some embodiments, conductive traces may be fabricated in the ceramic part, the conductive traces having essentially arbitrary shapes, whether they are on a surface of the ceramic article (e.g., chip carrier) or entirely within the ceramic (i.e., surrounded by the ceramic material). For example, a first conductive trace 125 may include a first portion 127 (which may have a length of 0.5 mm and transverse dimensions less than 100 microns) and a second portion 128 may be contiguous with the first portion, the first portion extending substantially in a first direction, and the second portion extending substantially in a second direction, differing from the first direction by at least 5 degrees (e.g., by about 90 degrees, as shown). Moreover, a second conductive trace 130 may include a first portion 132 entirely within the ceramic material, the first portion 132 having a length of 0.5 mm and transverse dimensions greater than 100 microns and less than 5000 microns. A third conductive trace 140, composed of a different material than the second conductive trace 130, may be in contact with a portion of the second conductive trace to form a thermocouple 142. One or more sheets of metal 145 may provide shielding (e.g., by reflecting electromagnetic radiation) or may operate as one or more wire bond pads.

Figure 1C:
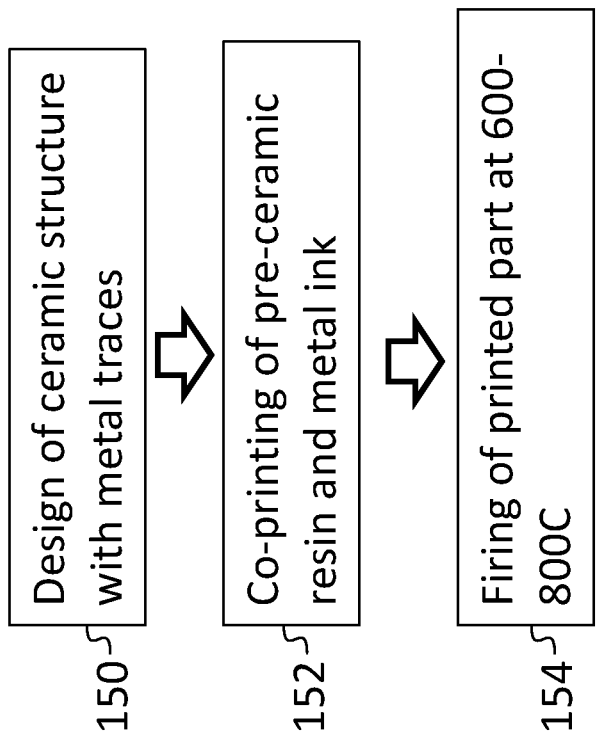
FIG. 1C is a flow chart, according to an embodiment of the present disclosure.
Figure 1D:
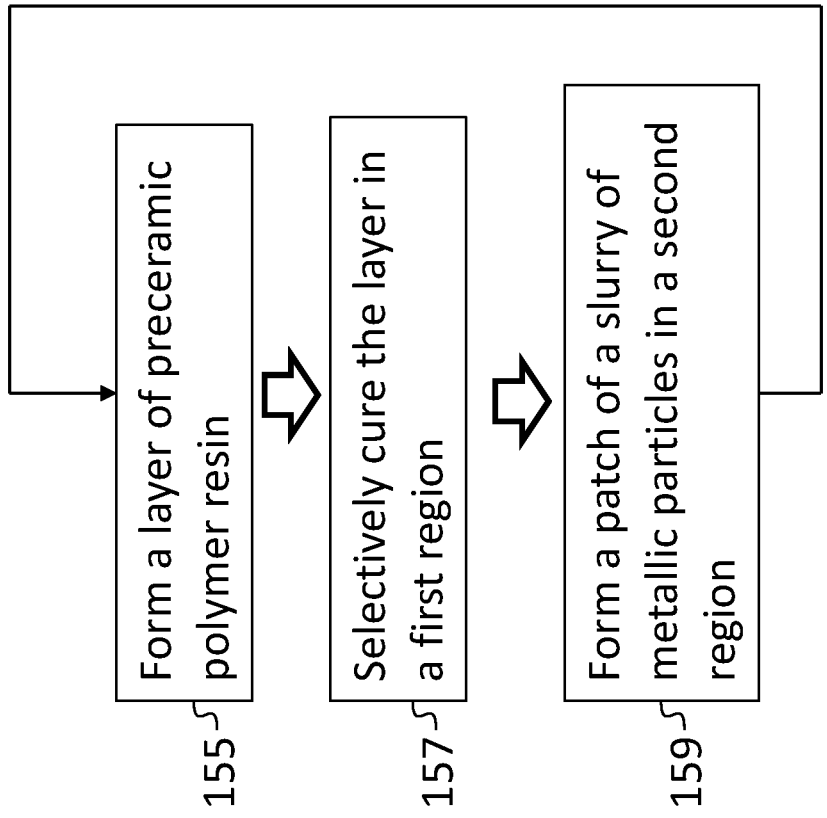
FIG. 1D is a flow chart, according to an embodiment of the present disclosure.

FIGS. 1C and 1D are flow charts of methods, in some embodiments. In FIG. 1C, a ceramic structure with metal traces is designed, at 150; at 152, pre-ceramic resin is co-printed with metal ink to form a preceramic precursor part; and, at 154, the preceramic precursor part is fired to produce a ceramic part with metal traces. FIG. 1D shows details of the co-printing process, in some embodiments. A layer of preceramic polymer resin is formed, at 155; at 157, the layer is selectively cured in a first region (corresponding to a ceramic portion of the part being fabricated); and, at 159, a patch of a slurry of metallic particles is formed in a second region (corresponding to a conductive trace in the part being fabricated). The process may be repeated to build up a preceramic precursor part, one layer at a time, as described in further detail above.

The transverse dimensions of the traces (e.g., the diameter, for a trace with a round cross section) may be between 1 micron and 1000 microns, or greater than 1000 microns. The metallic traces may be highly conductive (including, e.g., more than 50% metal by weight), to make electrical contact, and may be composed of, e.g., gold, silver, copper, aluminum, or alloys or mixtures thereof. The metallic traces may be resistive, and may act as heating wire; such traces may be composed of, e.g., nickel, cobalt, iron, refractory metals (Zr, Nb, Mo, Ru, Rh, Pd, Ta, W, Re, Os, Ir, Pd) or alloys or mixtures thereof. The metallic traces may be made of different metals or alloys or of a pair of alloys to act as a thermocouple, such as Ni—Cr and Ni—Al, Fe and Cu—Ni, Ni—Cr and Cu—Ni, Ni—Cr—Si and Ni—Si—Mg, Pt—Rh and Pt. In some embodiments, the metal is a highly reflective material that reflects radiant heat such as gold, silver, copper, or aluminum.

Figure 2:
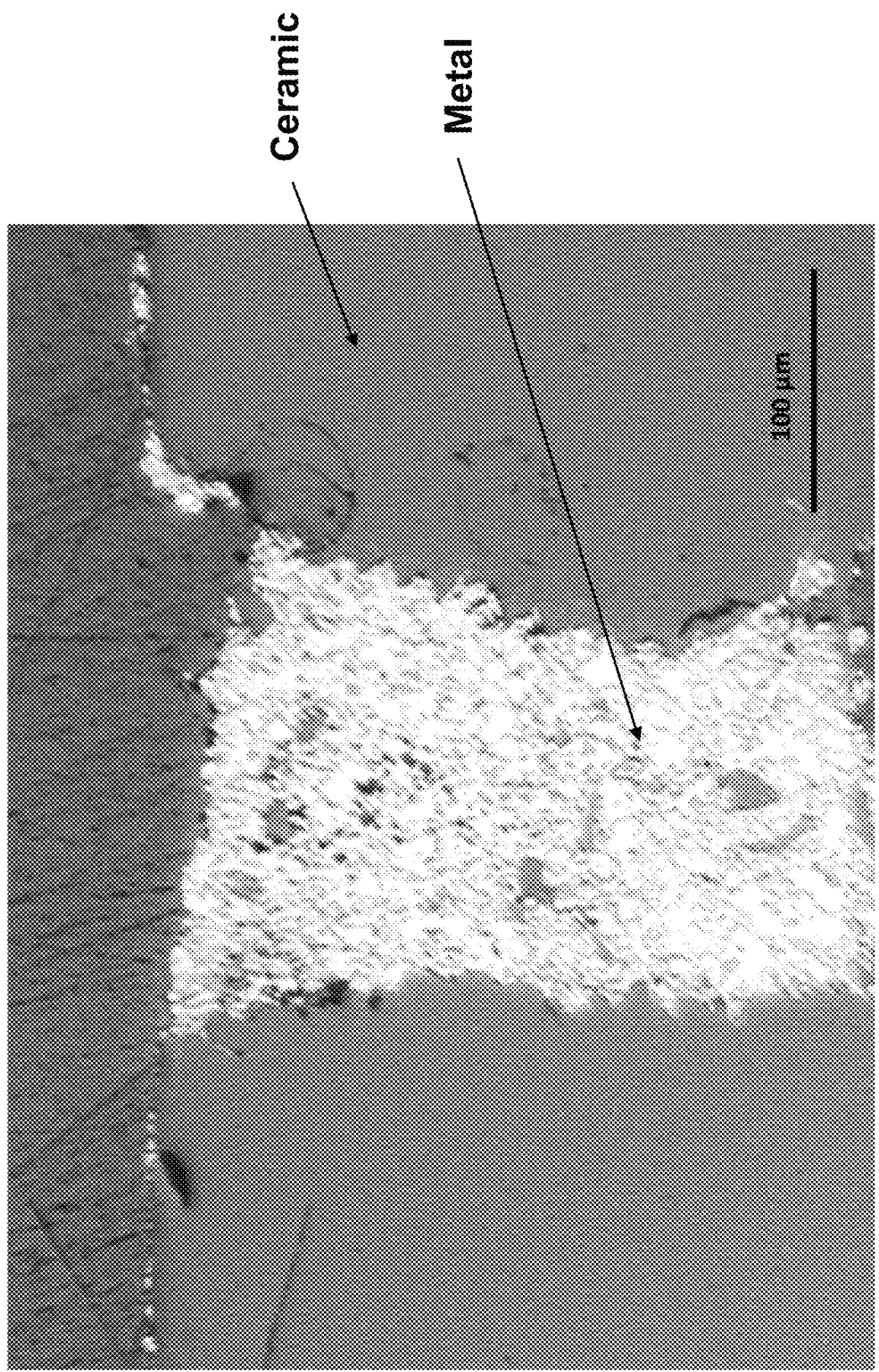
FIG. 2 is an optical image, of an embodiment of the present disclosure.
Figure 3:
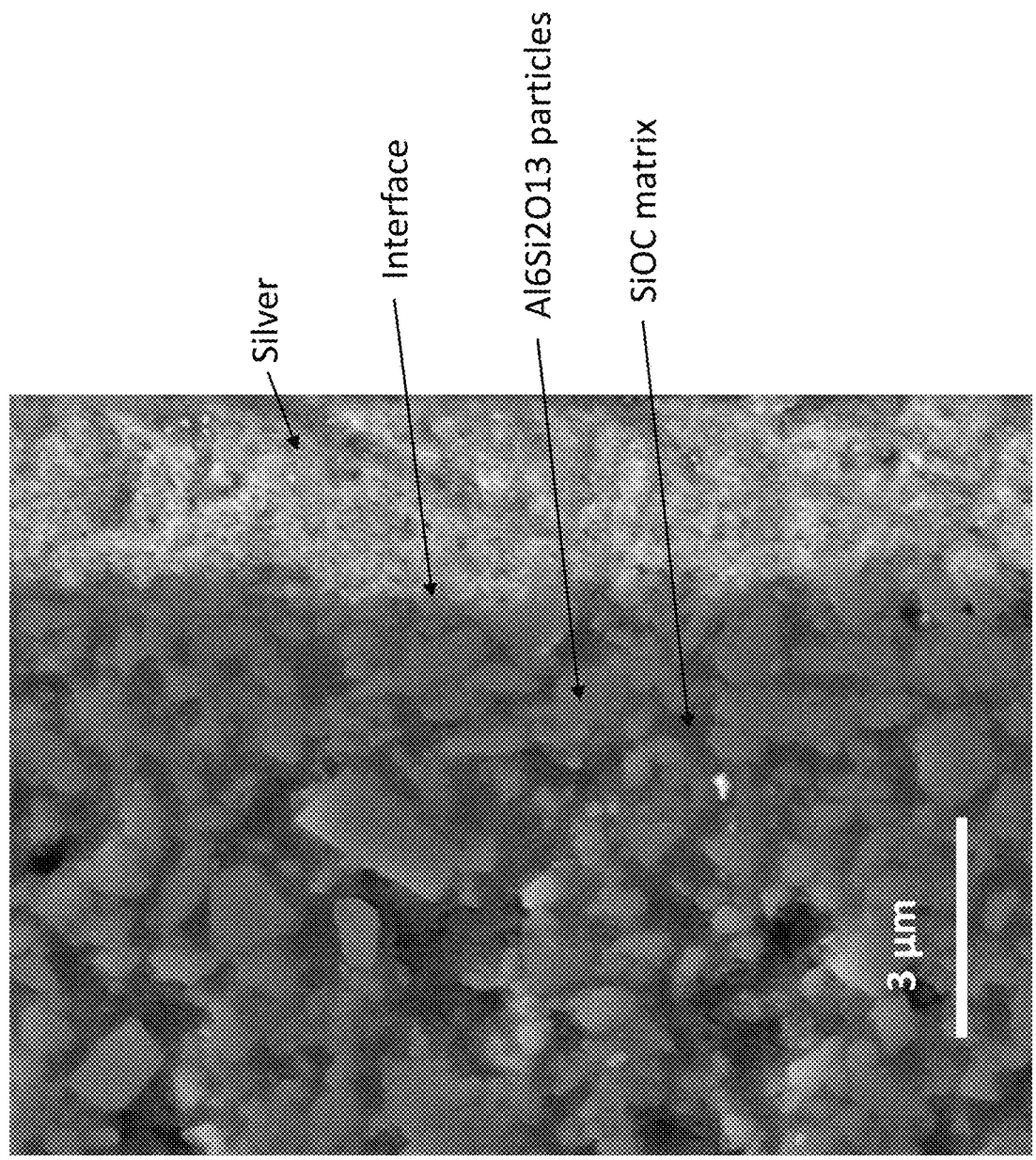
FIG. 3 is a scanning electron micrograph, of an embodiment of the present disclosure.

FIG. 2 shows a reduction to practice, in one embodiment. A pre-ceramic disk was 3D printed with holes of different sizes using a resin that included 30 vol % Al6Si2O13 (mullite) particles and 70 vol % UV-curable siloxane resin system, formulated by mixing (mercaptopropyl) methylsiloxane (available from Gelest Inc.) and vinylmethoxysiloxane (available from Gelest Inc.) at a 1:1 molar ratio of thiol/vinyl groups, a UV free radical photo initiator Irgacure® 819 (available from BASF SE.) at 0.25 wt % and a free radical scavenger as an inhibitor at 0.2%. The mullite particles had an average size of 0.7 microns. After printing the holes were filled with silver ink (Silverjet DGP-45HTG purchased from Sigma Aldrich Co.) which consisted of a dispersion of nanoparticles, ≤50 nm particle size, 30-35 wt % in triethylene glycol monoethyl ether. The part was then dried and pyrolyzed by heating under flowing argon to 750° C. for 30 minutes with a heating rate of 1° C./min and a cooling rate of 5° C./min. This heat treatment converted the preceramic resin to amorphous SiOC and sintered the silver nanoparticles together. The part was then cross-sectioned and polished; FIG. 2 shows an optical image. No melting of the metal or reaction of the metal with the ceramic during conversion is observed. FIG. 3 shows a scanning electron micrograph of the cross-section described above. A smooth, clean metal—ceramic interface is observed. No interdiffusion between metal and ceramic is observed. No chemical reaction between metal and ceramic is observed. The ceramic is >99% dense and could seal hermetically from the environment or atmosphere. Variations in shading visible in the ceramic portion FIG. 2 are due primarily to imaging noise and not to porosity of the ceramic. As such, some embodiments are able to form a dense, hermetic ceramic at as low a temperature as 750° C., which in turn makes possible the use of metals with relatively low melting points, such as silver, to form conductive traces and conductive pads (related art methods may sinter ceramic particles at much higher temperatures, e.g. 1600° C. which would melt silver and many other metals; such methods may be limited to using metals with high melting points, such as tungsten).

Figure 4A:
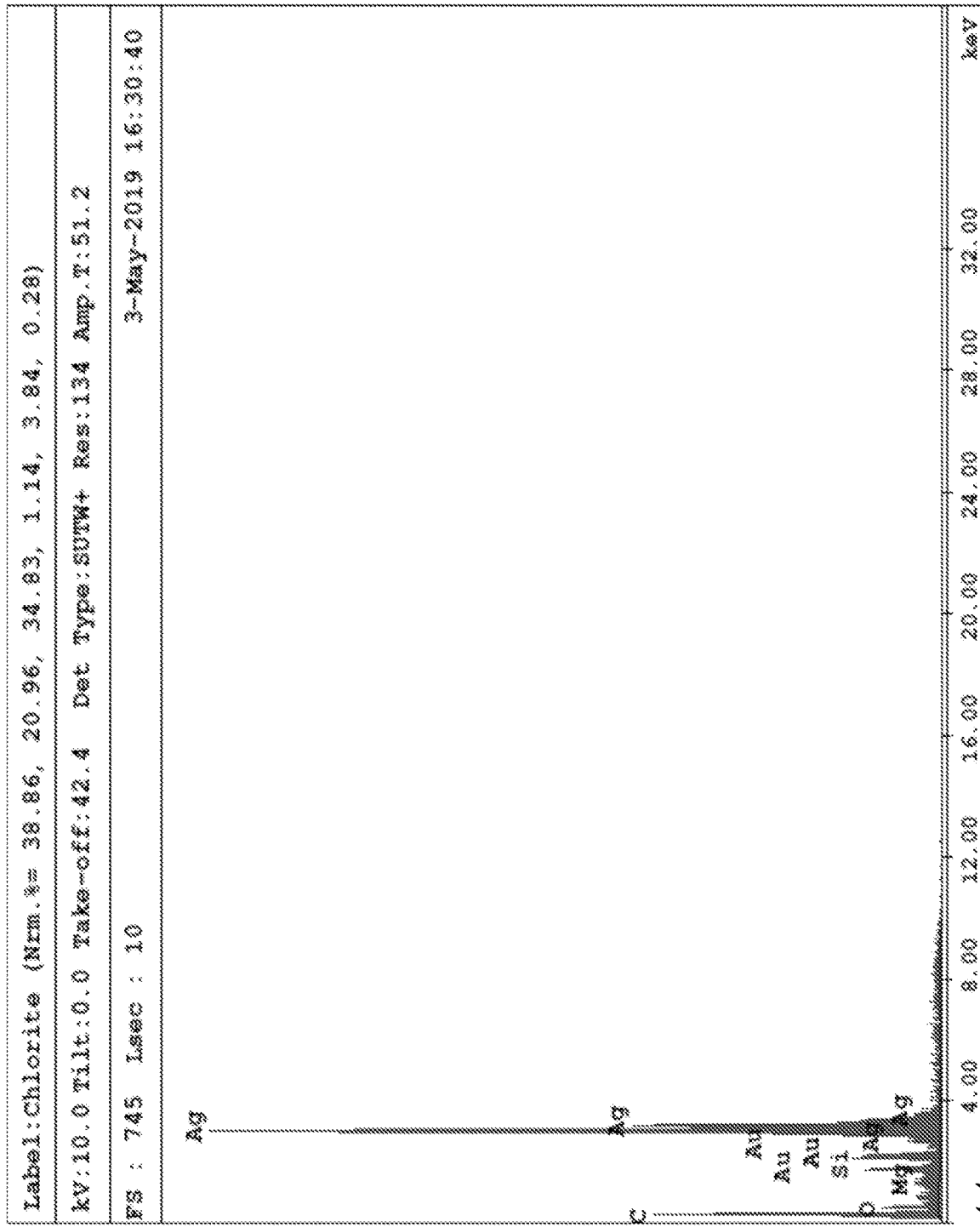
FIG. 4A shows results of an electron dispersive x-ray analysis, according to an embodiment of the present disclosure.
Figure 5A:
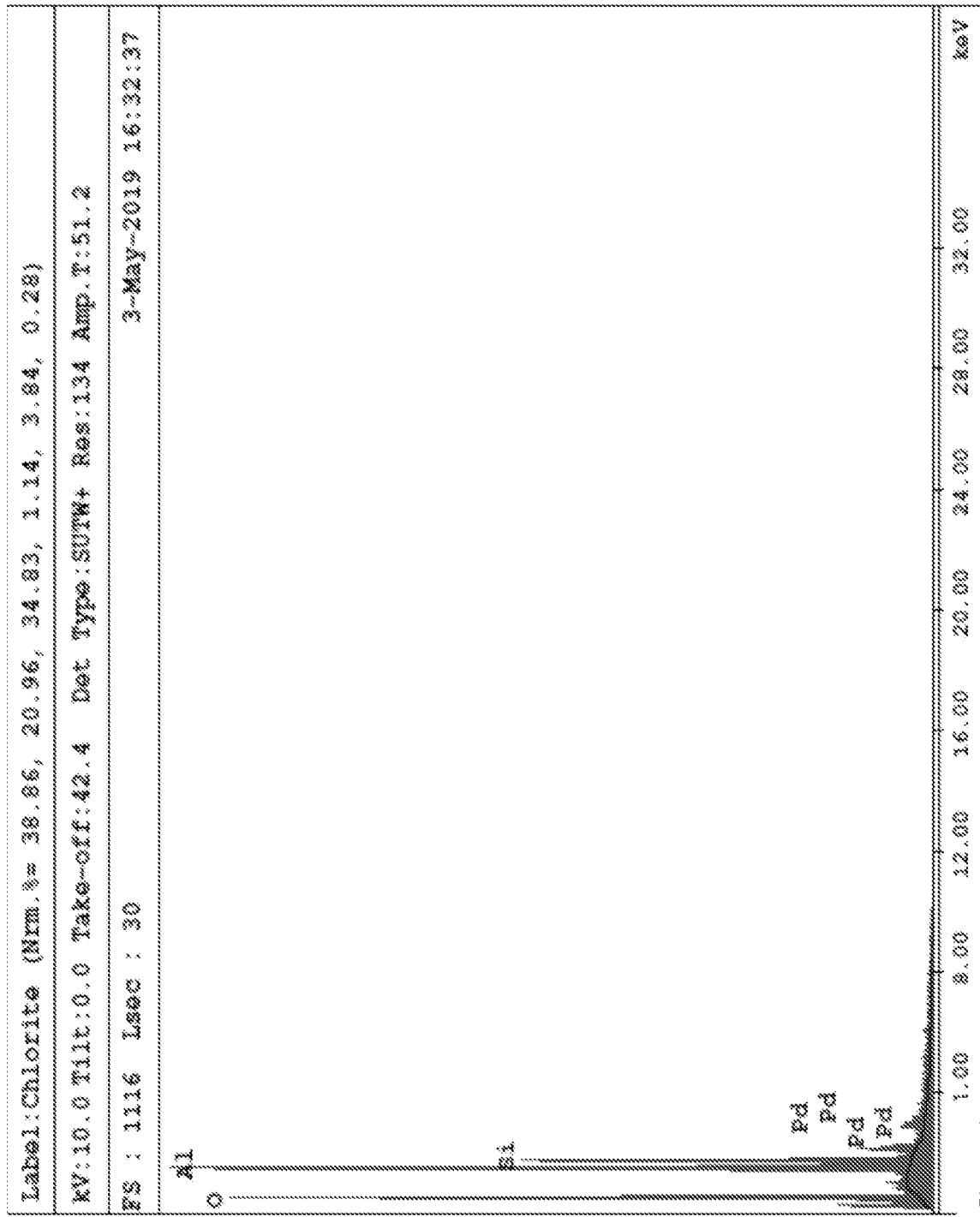
FIG. 5A shows results of an electron dispersive x-ray analysis, according to an embodiment of the present disclosure.

FIGS. 4A and 4B show electron dispersive x-ray analysis in a scanning electron microscope (SEM) of the silver ink after pyrolysis within 1 micron of the preceramic polymer part. Only 2 wt % oxygen and 1 wt % silicon is detected in the silver which is assumed to be from the ink itself and contamination. No aluminum is detected, demonstrating the absence of interdiffusion or chemical reaction between metal and ceramic. FIGS. 5A and 5B show electron dispersive x-ray analysis of the ceramic after pyrolysis within 1 micron of the silver ink. No silver is detected, demonstrating the absence of interdiffusion or chemical reaction between metal and ceramic.

As used herein, any structure or layer that is described as being "made of" or "composed of" a substance should be understood (i) in some embodiments, to contain that substance as the primary component or (ii) in some embodiments, to contain that substance as the major component. As used herein, "at %" refers to atomic percentage composition, and "wt %" refers to weight percentage composition. As used herein, "a portion of" something means all, or less than all, of the thing. As used herein, the word "or" is inclusive, so that, for example, "A or B" means any one of (i) A, (ii) B, and (iii) A and B. As used herein, an elongated element, such as a conductive trace, "extending substantially in a direction" means that the entire element is capable of fitting entirely within a cylindrical volume having (i) a diameter ten times the greatest transverse dimension of the element and (ii) an axis parallel to the direction.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a three-dimensional printed ceramic structure with metal traces have been specifically described and illustrated herein, many modifications and variations will be apparent to those skilled in the art. Accordingly, it is to be understood that a three-dimensional printed ceramic structure with metal traces constructed according to principles of this disclosure may be embodied other than as specifically described herein. The invention is also defined in the following claims, and equivalents thereof.

What is claimed is:
1. An article, comprising:
   a monolithic ceramic body extending from a top surface of the article to a bottom surface of the article and composed of a ceramic material; and
   a first conductive trace, the first conductive trace having a first portion entirely within the ceramic material, the first portion having a length of 0.5 mm and transverse dimensions less than 500 microns, the ceramic material comprising a plurality of ceramic particles in a ceramic matrix, and wherein the ceramic matrix comprises between 20 at % and 30 at % Si, between 30 at % and 40 at % C, and between 30 at % and 40 at % 0.

2. The article of claim 1, wherein the first conductive trace further has a second portion, contiguous with the first portion, the first portion extending substantially in a first direction, and the second portion extending substantially in a second direction, differing from the first direction by at least 5 degrees.

3. The article of claim 1, wherein the ceramic matrix comprises between 0 at % and 50 at % N.

4. The article of claim 1, wherein a particle of the plurality of ceramic particles comprises, as a major component, a material selected from a group consisting of alumina, mullite, silica, aluminosilicates, silica based glasses, silicon nitride, silicon carbide, zirconia, boron nitride, magnesium aluminate spinel, yttrium aluminate garnet, rare earth silicates, aluminum phosphate, and combinations thereof.

5. The article of claim 1, further comprising a second conductive trace, the second conductive trace having a first portion entirely within the ceramic material, the first portion of the second conductive trace having a length of 0.5 mm and transverse dimensions greater than 100 microns and less than 5000 microns.

6. The article of claim 1, wherein the first conductive trace comprises at least 50% metal by weight, the metal being selected from a group consisting of gold, silver, copper, nickel, cobalt, iron, Al, Zr, Nb, Mo, Ru, Rh, Pd, Ta, W, Re, Os, Ir, Pd, alloys thereof, and combinations thereof.

7. The article of claim 1, further comprising:
a second conductive trace; and
a third conductive trace composed of a different material than the second conductive trace,
a portion of the second conductive trace being in contact with a portion of the third conductive trace to form a thermocouple.

8. The article of claim 7, wherein the portion of the second conductive trace and the portion of the third conductive trace are composed of different materials of a pair of materials selected from a group of pairs of materials consisting of Ni—Cr and Ni—Al, Fe and Cu—Ni, Ni—Cr and Cu—Ni, Ni—Cr—Si and Ni—Si—Mg, and Pt—Rh and Pt.

9. The article of claim 1, wherein the article is a chip carrier comprising an integrated circuit die, the first conductive trace being a portion of a conductive path from the integrated circuit die to a conductor on an external surface of the chip carrier.

10. The article of claim 1, comprising a sheet of metal configured to reflect electromagnetic radiation or to operate as a wire bond pad, the sheet of metal being composed of a material selected from a group consisting of gold, silver, copper, aluminum, and alloys and combinations thereof.

11. An article, comprising:
a monolithic ceramic body extending from a top surface of the article to a bottom surface of the article and composed of a ceramic material; and
a first conductive trace,
the first conductive trace having a first portion entirely within the ceramic material,
the first conductive trace comprising, as a major component, a material selected from a group consisting of copper, silver, gold, and alloys and combinations thereof, and
the ceramic material comprising a ceramic matrix with a composition comprising 20-30 at % Si, 30-40 at % C, and 30-40 at % O and 0-50 at % N.

12. A 3D printed article comprising:
a body composed of:
a pre-ceramic material, and
a first metal-containing trace,
the first metal-containing trace being composed of at least 30 vol % metal and having a first portion entirely within the ceramic material,
the first portion having a length of 0.5 mm and transverse dimensions less than 500 microns,
the pre-ceramic material comprising a pre-ceramic polymer matrix; and
wherein the first metal-containing trace contains at least 30 vol % metal particles in an organic matrix.

13. The 3D printed article of claim 12, wherein the pre-ceramic polymer matrix contains one or more of the following: poly-siloxane, poly-carbo-siloxane, poly-carbo-silane, poly-silazane, and/or polysilsesquioxane.

14. An article, comprising:
a monolithic ceramic body extending from a top surface of the article to a bottom surface of the article and composed of a ceramic material; and
a first conductive trace,
the first conductive trace having a first portion entirely within the ceramic material, the first portion having a length of 0.5 mm and transverse dimensions less than 500 microns,
the ceramic material comprising a plurality of ceramic particles in a ceramic matrix, and
wherein the ceramic matrix comprises between 20 at % and 30 at % Si, between 30 at % and 40 at % C, between 3 at % and 20 at % O, and between 15 at % and 36 at % N.

15. The article of claim 14, wherein the first conductive trace further has a second portion, contiguous with the first portion, the first portion extending substantially in a first direction, and the second portion extending substantially in a second direction, differing from the first direction by at least 5 degrees.

16. The article of claim 14, wherein a particle of the plurality of ceramic particles comprises, as a major component, a material selected from a group consisting of alumina, mullite, silica, aluminosilicates, silica based glasses, silicon nitride, silicon carbide, zirconia, boron nitride, magnesium aluminate spinel, yttrium aluminate garnet, rare earth silicates, aluminum phosphate, and combinations thereof.

17. The article of claim 14, further comprising a second conductive trace, the second conductive trace having a first portion entirely within the ceramic material, the first portion of the second conductive trace having a length of 0.5 mm and transverse dimensions greater than 100 microns and less than 5000 microns.

18. The article of claim 14, wherein the first conductive trace comprises at least 50% metal by weight, the metal being selected from a group consisting of gold, silver, copper, nickel, cobalt, iron, Al, Zr, Nb, Mo, Ru, Rh, Pd, Ta, W, Re, Os, Ir, Pd, alloys thereof, and combinations thereof.

19. The article of claim 14, further comprising:
a second conductive trace; and
a third conductive trace composed of a different material than the second conductive trace, a portion of the second conductive trace being in contact with a portion of the third conductive trace to form a thermocouple.

20. The article of claim 19, wherein the portion of the second conductive trace and the portion of the third conductive trace are composed of different materials of a pair of materials selected from a group of pairs of materials consisting of Ni—Cr and Ni—Al, Fe and Cu—Ni, Ni—Cr and Cu—Ni, Ni—Cr—Si and Ni—Si—Mg, and Pt—Rh and Pt.

21. The article of claim 14, wherein the article is a chip carrier comprising an integrated circuit die, the first conductive trace being a portion of a conductive path from the integrated circuit die to a conductor on an external surface of the chip carrier.

22. The article of claim 14, comprising a sheet of metal configured to reflect electromagnetic radiation or to operate as a wire bond pad, the sheet of metal being composed of a material selected from a group consisting of gold, silver, copper, aluminum, and alloys and combinations thereof.

* * * * *